US012757742B2

(12) United States Patent
Yang

(10) Patent No.: US 12,757,742 B2
(45) Date of Patent: Oct. 6, 2026

(54) MEMORY DEVICE PACKAGE HAVING SCRIBE LINE AND METHOD FOR MANUFACTURING THE SAME

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 317 days.

(21) Appl. No.: 18/367,626

(22) Filed: Sep. 13, 2023

(65) Prior Publication Data

US 2024/0170412 A1 May 23, 2024

Related U.S. Application Data

(62) Division of application No. 18/056,549, filed on Nov. 17, 2022.

(51) Int. Cl.

| | |
|---|---|
| ***H10W 46/00*** | (2026.01) |
| ***H10P 54/00*** | (2026.01) |
| ***H10P 74/00*** | (2026.01) |
| ***H10W 70/65*** | (2026.01) |
| ***H10W 90/00*** | (2026.01) |
| *H10W 72/50* | (2026.01) |

(52) U.S. Cl.

CPC ............. *H10W 46/00* (2026.01); *H10P 54/00* (2026.01); *H10P 74/273* (2026.01); *H10W 70/65* (2026.01); *H10W 90/00* (2026.01); *H10W 46/503* (2026.01); *H10W 72/5453* (2026.01)

(58) Field of Classification Search

CPC ... H01L 23/544; H01L 23/5381; H01L 21/78; H01L 22/32; H01L 24/48; H01L 25/0655; H01L 25/50; H01L 2223/5446; H01L 2224/48132; H10W 46/00; H10W 46/503; H10W 90/00; H10W 70/65; H10W 72/5453; H10P 54/00; H10P 74/273

See application file for complete search history.

(56) References Cited

U.S. PATENT DOCUMENTS

| | | | | |
|---|---|---|---|---|
| 2015/0380357 | A1 | 12/2015 | Liu et al. | |
| 2018/0181524 | A1* | 6/2018 | Schulz | H03K 19/1736 |
| 2020/0343198 | A1* | 10/2020 | Tsai | H01L 21/561 |

(Continued)

FOREIGN PATENT DOCUMENTS

| | | |
|---|---|---|
| TW | 201340256 A | 10/2013 |

OTHER PUBLICATIONS

Office Action and Search Report mailed on May 13, 2024 related to Taiwanese Application No. 112117908.

(Continued)

*Primary Examiner* — Timor Karimy

(74) *Attorney, Agent, or Firm* — Xuan Zhang

(57) ABSTRACT

A memory device package and a method of manufacturing a memory device package. The memory device package includes a substrate having a first chip region, a second chip region, and a first scribe line region connected between the first chip region and the second chip region. The memory device package also includes a first memory chip disposed over the first chip region and a second memory chip disposed over the second chip region.

8 Claims, 16 Drawing Sheets

(56) References Cited

U.S. PATENT DOCUMENTS

| | | | |
|---|---|---|---|
| 2021/0375681 | A1 | 12/2021 | Han |
| 2023/0402335 | A1 | 12/2023 | Huang et al. |

OTHER PUBLICATIONS

Office Action and and the search report mailed on Jun. 26, 2025 related to U.S. Appl. No. 18/056,549, wherein this application is a DIV of U.S. Appl. No. 18/056,549.
Office Action and Search Report mailed on Oct. 29, 2024 related to Taiwanese Application No. 113100813.
Office Action and and the search report mailed on Feb. 2, 2026 related to U.S. Appl. No. 18/056,549, wherein this application is a DIV of U.S. Appl. No. 18/056,549.
Office Action and and the search report mailed on Nov. 14, 2025 related to U.S. Appl. No. 18/056,549, wherein this application is a DIV of U.S. Appl. No. 18/056,549.

* cited by examiner

1a

1c

2a

MEMORY DEVICE PACKAGE HAVING SCRIBE LINE AND METHOD FOR MANUFACTURING THE SAME

CROSS-REFERENCE TO RELATED APPLICATION

This application is a divisional application of U.S. Non-Provisional application Ser. No. 18/056,549 filed Nov. 17, 2022, which is incorporated herein by reference in its entirety.

TECHNICAL FIELD

The present disclosure relates to a memory device package and a method for manufacturing a memory device package, and more particularly, to a memory device package having a scribe line.

DISCUSSION OF THE BACKGROUND

Due to rapid development in memory research, memory chip size has been reduced to meet demands of higher integration, memory capacity, and operating speeds.

In a conventional manufacturing process for memory chips, every memory chip of different sizes involves multiple photolithographic processing operations, in each of which a particular layout design and photomask of specific dimensions and/or patterns are required. Such requirements can greatly increase time and cost of manufacturing memory chips of different sizes.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device package. The memory device package includes a substrate having a first chip region, a second chip region, and a first scribe line region connected between the first chip region and the second chip region. The memory device package also includes a first memory chip disposed over the first chip region and a second memory chip disposed over the second chip region.

Another aspect of the present disclosure provides a memory device package. The memory device package includes a substrate having a first scribe line region, a first memory chip disposed over the substrate and a second memory chip disposed over the substrate. The second memory chip is electrically connected with first memory chip through a circuit layer extending across the first scribe line region.

Another aspect of the present disclosure provides a method of manufacturing a memory device package. The method includes providing a wafer, forming a first memory chip over the wafer, and forming a second memory chip over the wafer. The method also includes forming a first scribe line region in the wafer and between the first memory chip and the second memory chip. The method also includes separating a substrate having the first scribe line region, the first memory chip, and the second memory chip from the wafer.

According to some embodiments of the present disclosure, different numbers of memory chips on the wafer are scribed or separated together into one (or singular) bundled memory chip according to the customized memory capacities. The bundled memory chip includes circuit layers in the wafer extending across the scribe line region. The circuit layers are configured to electrically connect memory chips and to combine the capacity (or the memory size) of the memory chips.

The structure having the circuit layers in the wafer extending across the scribe line region can fulfill the customized connection configuration across memory device family members with different organizations or memory capacities (such as 2 Gb, 4 Gb, 8 Gb). The bundled memory chip can thus be encapsulated in a memory device package without redesigning the routing and the photomasks thereof to adapt to the different memory capacity. As a result, time and cost of fabricating different memory chips can be greatly reduced.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
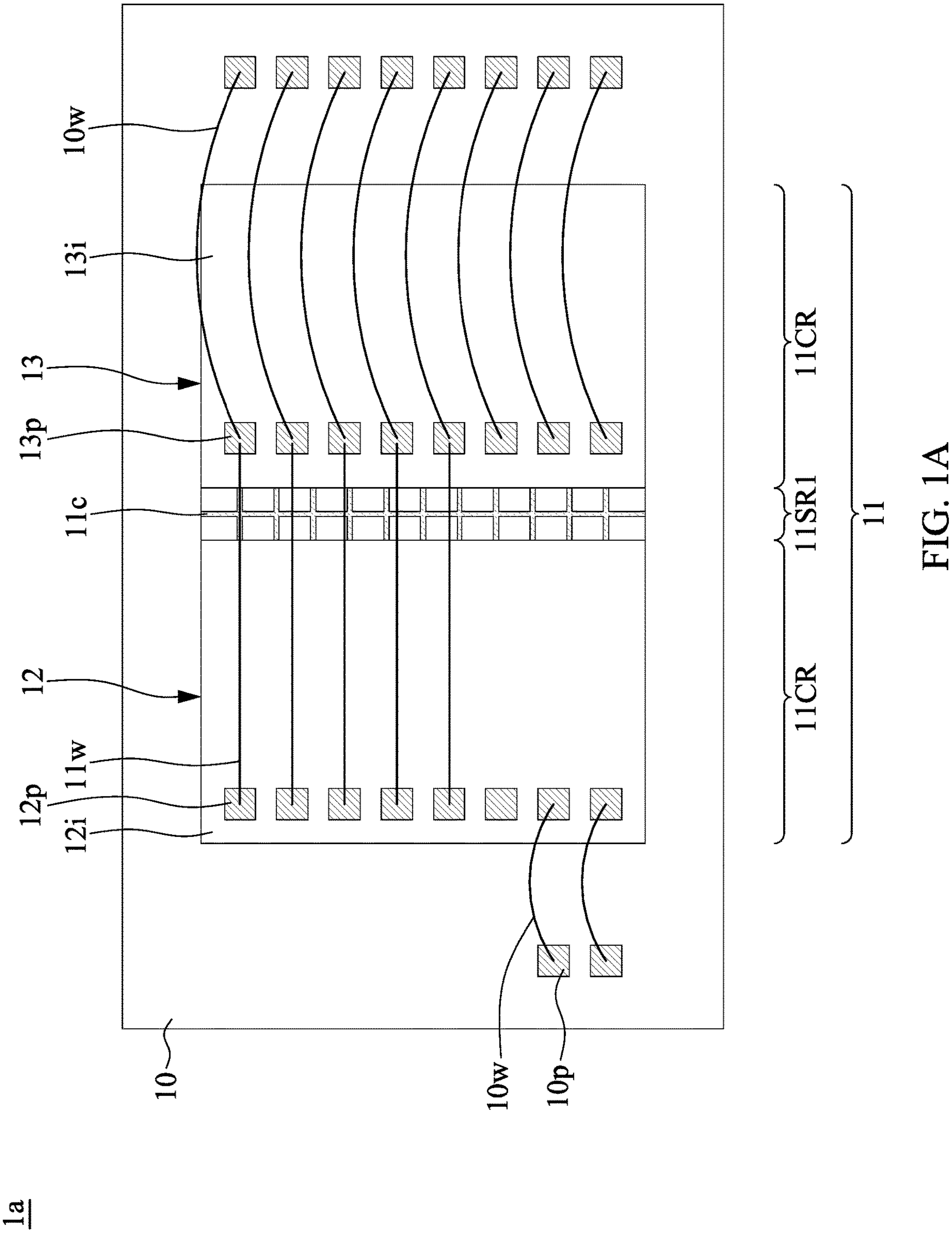
FIG. 1A is a schematic top view of a memory device package in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
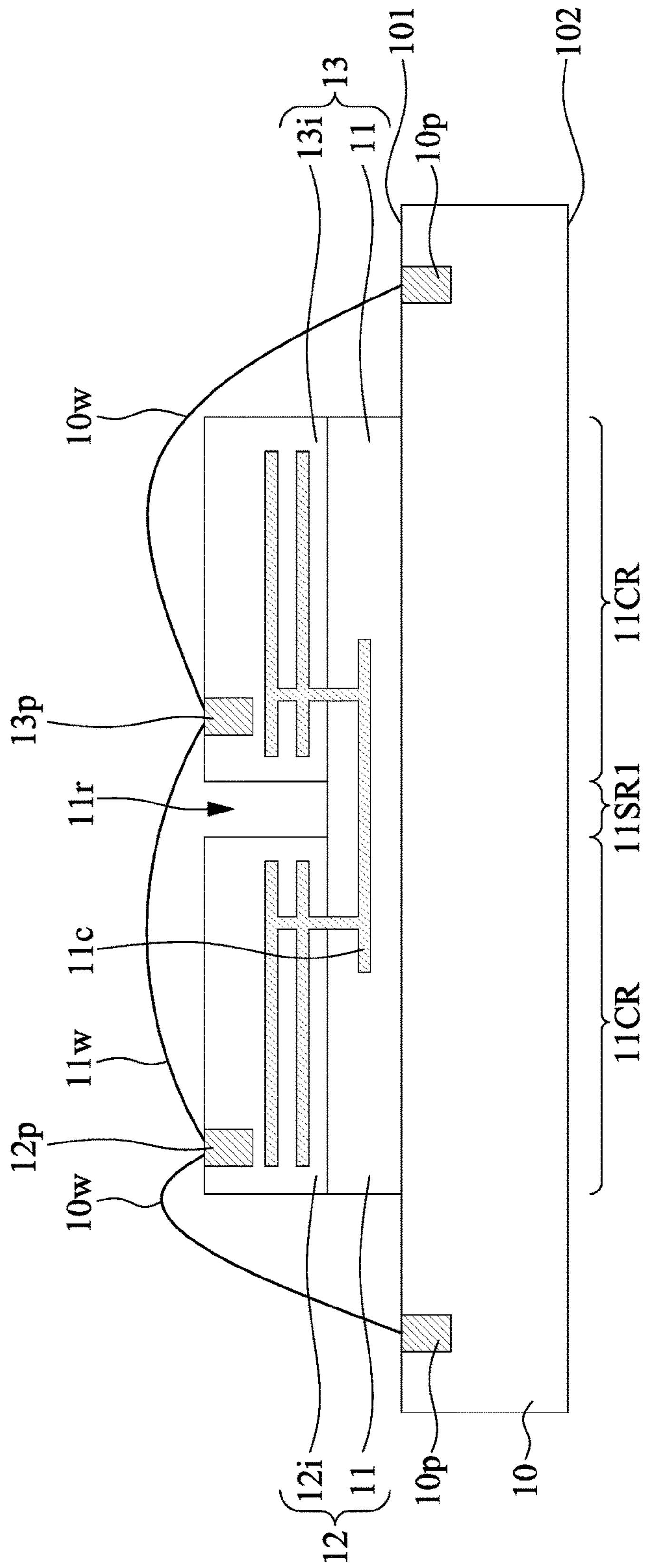
FIG. 1B is a schematic cross-sectional view of a memory device package in accordance with some embodiments of the present disclosure.

FIG. 1A is a schematic top view of a memory device package 1*a* in accordance with some embodiments of the present disclosure. FIG. 1B is a schematic cross-sectional view of the memory device package 1*a* in accordance with some embodiments of the present disclosure.

The memory device package 1*a* may include a volatile memory device package or a non-volatile memory device package. The memory device package 1 may include a dynamic random access memory (DRAM) device package, a static random access memory (SRAM) device package, a resistive random access memory (RRAM) device package, a magneto-resistive RAM (MRAM) device package, a phase-change RAM (PRAM) device package, a ferroelectric random access memory (FeRAM) device package, a flash memory device package, etc.

Referring to FIG. 1A and FIG. 1B, in some embodiments, the memory device package 1*a* may include a carrier 10, a substrate 11, and memory chips 12 and 13.

In some embodiments, the carrier 10 may include a package board, a main board, a printed circuit board (PCB), such as a paper-based copper foil laminate, a composite copper foil laminate, or a polymer-impregnated glass-fiber-based copper foil laminate.

In some embodiments, the components (such as the memory chips 12 and 13) of the memory device package 1*a* may be located over or attached or operatively coupled to the same carrier 10. For example, the memory chips 12 and 13 may be disposed over or on a surface 101 (annotated in FIG. 1B) of the carrier 10.

In some embodiments, the carrier 10 may include an interconnection structure, such as a redistribution layer (RDL), a circuit layer, a conductive pad, a conductive trace, a conductive via, etc. The carrier 10 may also include one or more dielectric layers. A portion of the interconnection structure be exposed by the dielectric layers, while another portion of the interconnection structure may be covered by the dielectric layers. For example, a conductive trace may be disposed over or on a dielectric layer and a conductive via may penetrate or traverse the dielectric layer to electrically connect with another conductive trace.

In some embodiments, the interconnection structure of the carrier 10 may include copper (Cu), silver (Ag), aluminum (Al), gold (Au), or other metal or an alloy thereof. In some embodiments, the dielectric layers of the carrier 10 may include Prepreg (PP), Ajinomoto build-up film (ABF), solder resist or other suitable materials.

For example, the carrier 10 may include one or more conductive pads 10*p* in proximity to, adjacent to, or embedded in and exposed by the surface 101 of the carrier 10. The carrier 10 may include a solder resist (not shown) on the surface 101 of the carrier 10 to fully expose or to expose at least a portion of the conductive pads 10*p* for forming electrical connections with the memory chips 12 and 13. For example, the carrier 10 may electrically connect to the memory chips 12 and 13 through conductive wires 10*w*.

In some embodiments, one or more external contact terminals (not shown) may be disposed over or on the surface 101 of the carrier 10 or a surface 102 (annotated in FIG. 1B) opposite to the surface 101. The external contact terminals may include solder balls.

The substrate 11 may be disposed over or on the surface 101 of the carrier 10. In some embodiments, the substrate 11 may be attached to the surface 101 of the carrier 10 through an adhesive layer (not shown). The adhesive layer may be disposed between the substrate 11 and the carrier 10. In some embodiments, the adhesive layer may include an adhesive material, such as epoxy, a die attach film (DAF), glue or the like.

In some embodiments, the substrate 11 may include a semiconductor substrate such as a silicon wafer or a silicon on insulator (SOI) wafer. In some embodiments, the substrate 11 may include a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. The substrate 11 may include a semiconductor material or a material having a semiconductor characteristic. For example, the substrate 11 may include at least one of silicon (Si), germanium (Ge), silicon-germanium (SiGe), gallium-arsenic (GaAs), indium-gallium-arsenic (InGaAs), or aluminum-gallium-arsenic (AlGaAs). In some other embodiments, the substrate 11 may include plastic materials, ceramic materials, or the like.

In some embodiments, the substrate 11 may include chip regions 11CR and a scribe line region 11SR1 between the chip regions 11CR. The scribe line region 11SR1 may connect the chip regions 11CR. The scribe line region 11SR1 may extend between the chip regions 11CR. The chip regions 11CR may be separated from each other by the scribe line region 11SR1.

Figure 3A:
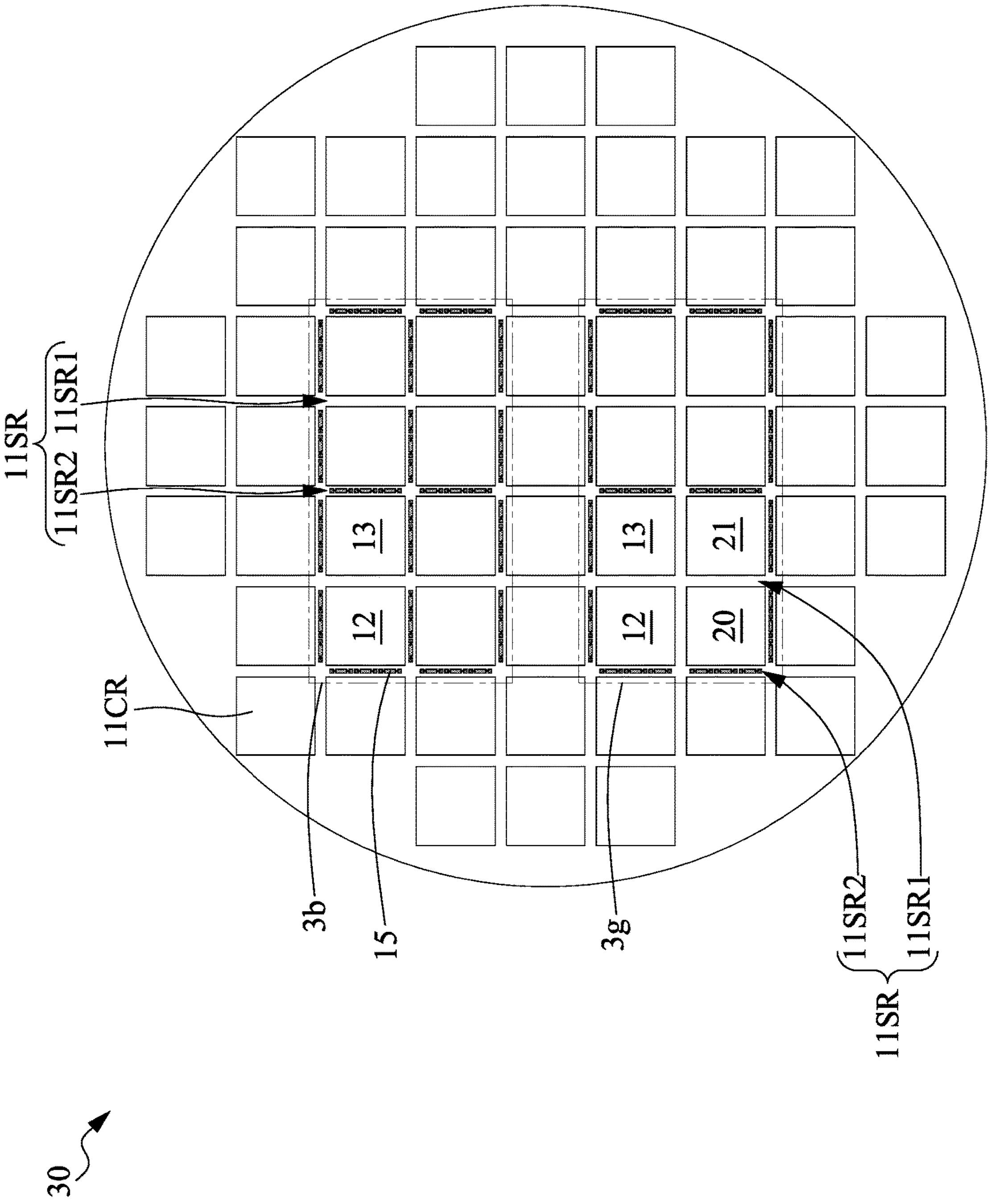
FIG. 3A illustrates one or more stages of a method of manufacturing a memory device package in accordance with some embodiments of the present disclosure.

FIG. 3A is a schematic diagram illustrating a wafer 30 with a plurality of repeating units (which may be referred to as dies). The dies may be formed on the chip regions 11CR, respectively. The dies may include a DRAM die, a SRAM die, a RRAM die, a MRAM die, a PRAM die, a FeRAM die, a flash memory die, etc.

The chip regions 11CR (and the dies over the chip regions 11CR) may be surrounded by the scribe line regions 11SR. The chip regions 11CR (and the dies over the chip regions 11CR) may be divided or partitioned by the scribe line regions 11SR. The chip regions 11CR (and the dies over the chip regions 11CR) may be isolated or separated from one another by the scribe line regions 11SR.

The chip regions 11CR (and the dies over the chip regions 11CR) may be arranged in an m×n matrix (where m is an integer equaling or exceeding 1 and n is an integer equaling or exceeding 2) on the wafer 30. The chip regions 11CR (and the dies over the chip regions 11CR) may be two-dimensionally arranged on the wafer 30 and may be surrounded by the scribe line regions 11SR when viewed from a plan view. In other words, the scribe line regions 11SR may be disposed between the chip regions 11CR (and the dies over the chip regions 11CR). As used herein, it will be understood that elements that are referred to as being two-dimensionally arranged may be arranged in two dimensions along a plane. For example, elements that are two-dimensionally arranged may include an array of elements that are formed into rows and columns.

The scribe line regions 11SR may include grooves or lanes running orthogonally. In some embodiments, the angles between the scribe line regions 11SR may exceed 90°. In some embodiments, the angles between the scribe line regions 11SR may be less than 90°. As shown in FIG. 3A, the scribe line regions 11SR of the wafer 30 can be divided into at least two types, such as the scribe line regions 11SR1 and the scribe line regions 11SR2.

In some embodiments, the scribe line regions 11SR2 may be finally scribed by, for example, a die saw operation, a scribe operation and/or a break operation, after fabrication of the wafer 30 is completed.

The scribe line regions 11SR1 may not be scribed by the die saw operation. In other words, the scribe line regions 11SR1 may be maintained between the chip regions 11CR (and the dies over the chip regions 11CR). For example, after fabrication of the wafer 30 is completed, a plurality of chip regions 11CR (and the dies over the chip regions 11CR) may be separated from one another by the scribe line regions 11SR2.

In some embodiments, the scribe line regions 11SR2 may have testing areas, over which a plurality of testing elements 15 are used for assessing electric properties of elements constituting an integrated circuit chip (e.g., the chip regions 11CR and the dies over the chip regions 11CR). The testing elements 15 may include wiring, plugs, vias, patterns, pads, etc. For example, the testing elements 15 may be electrically tested for determining whether elements of the chip regions 11CR and the dies over the chip regions 11CR are suitably formed on the wafer 30 in a manufacturing process. The scribe line regions 11SR1 may not have testing areas.

In some embodiments, the plane size of each of the chip regions 11CR may be between about 3 millimeters (mm)×4 mm and about 10 mm×10 mm. In some embodiments, the width of each of the scribe line regions 11SR may be between about 60 micrometers (μm) and about 70 μm. In some embodiments, the width of each of the scribe line regions 11SR may be greater than the thickness of the blade used for dicing the wafer 30. In some embodiments, after the scribe line regions 11SR2 are scribed, the width of each of the scribe line regions 11SR2 may be less than the width of each of the scribe line regions 11SR1.

In some embodiments, each die may be configured to store information, data, or a program run on a computing device or memory controller. In some embodiments, each die may be the smallest structure visible to the computing device or the memory controller. In some embodiments, each die may operate independently.

In some embodiments, each die may have a cell transistor (or an access transistor), a cell capacitor (or a storage capacitor), and other integrated circuits. The cell transistor may include a fin field effect transistor (finFET), a multi-bridge channel (MBC) transistor, a nanowire transistor, a vertical transistor, a recess channel transistor, a three-dimensional (3-D) transistor, a planar transistor, or a combination thereof. The cell capacitor may include various kinds of 3-D capacitors. Other integrated circuits may include a gate electrode, source/drain regions, a buried word line, a buried contact plug, a bit plug, a bit line, a landing pad, etc.

Specifically, the access transistor may be used to control the channel of the die by opening or closing the gate of the access transistor. The storage capacitor may be used to store information according to the state of electrical charges stored therein. The storage capacitor in an empty state, that is, no charge, may be denoted a logic value of 0. The storage capacitor in a fully-charged state may be denoted a logic value of 1.

In some embodiments, each die may have a capacity (or a memory size) of approximately 1 gigabyte (Gb). For example, after fabrication of the wafer 30 is completed, the wafer 30 may be scribed into a plurality of individual separable memory dies, each having a capacity of approximately 1 Gb.

However, it may be required to scribe a plurality of dies (such as two, four, eight, or more) together into one (or singular) bundled memory chip.

For example, two dies in the dotted area 3*b* in FIG. 3A may be separated from other dies by the scribe line regions 11SR2 and bundled together into one bundled memory chip (which includes the memory chips 12 and 13).

For example, four dies in the dotted area 3*g* in FIG. 3A may be separated from other dies by the scribe line regions 11SR2 and bundled together into one bundled memory chip (which includes the memory chips 12, 13, 20, 21).

The bundled memory chip may be packaged in one memory device package like the memory device packages 1*a*, 1*c*, 2*a*, and 2*b* shown in FIGS. 1A, 1C, 2A, and 2B.

For example, the dies may be bundled together to form a memory device package having a capacity equals to a sum of the capacity of each die.

For example, if a capacity (or a memory size) of each die is 1Gb, respectively, the bundled memory chip could have a larger capacity, such as 2Gb, 4Gb, 8Gb, etc.

Referring back to FIG. 1A and FIG. 1B, the memory device package 1*a* may include two dies in total. For example, the memory device package 1*a* may include 2Gb. For example, the memory chips 12 and 13 may be dies bundled together into one bundled memory chip. The memory chips 12 and 13 may include the dies over the chip regions 11CR. The scribe line region 11SR1 may be disposed between the memory chips 12 and 13. The memory chips 12 and 13 may be separated by a recessed portion or a gap 11*r* over the scribe line region 11SR1.

The memory chip 12 may include a part of the chip region 11CR (such as the chip region 11CR on the left) and integrated circuits formed over the part of the chip region 11CR. The integrated circuits formed over the part of the chip region 11CR may be protected by one or more insulating layers 12*i*. In the part of the chip region 11CR on the left, the memory chip 12 may include a cell transistor (or an access transistor), a cell capacitor (or a storage capacitor), and other integrated circuits.

A plurality of conductive pads 12*p* may be disposed over or on the insulating layers 12*i*. The conductive pads 12*p* may electrically connect with the carrier 10 through the conductive wires 10*w*. From a top view, the conductive pads 12*p* are arranged in a line.

Similarly, the memory chip 13 may include a part of the chip region 11CR (such as the chip region 11CR on the right) and integrated circuits formed over the part of the chip region 11CR. The integrated circuits formed over the part of the chip region 11CR may be protected by one or more insulating layers 13*i*. In the part of the chip region 11CR on the right, the memory chip 13 may include a cell transistor (or an access transistor), a cell capacitor (or a storage capacitor), and other integrated circuits.

A plurality of conductive pads 13*p* may be disposed over or on the insulating layers 13*i*. The conductive pads 13*p* may electrically connect with the carrier 10 through the conductive wires 10*w*. From a top view, the conductive pads 13*p* are arranged in a line. The conductive pads 13*p* may be adjacent to a side of the memory chip 13 closest to the memory chip 12.

The memory chip 12 and the memory chip 13 may electrically connect with each other by conductive elements, such as the conductive wires 11*w*, the circuit layers 11*c*, or both.

In some embodiments, one or more of the conductive pads 12*p* may electrically connect with the memory chip 13 through the conductive wires 11*w*. In other words, in some embodiments, one or more of the conductive pads 13*p* may electrically connect with the memory chip 12 through the conductive wires 11*w*. The conductive wires 11*w* may be disposed outside of the substrate 11. The conductive wires 11*w* may be disposed outside of the memory chip 12 and the memory chip 13.

The conductive wires 11*w* may extend between the chip regions 11CR. The conductive wires 11*w* may extend across the scribe line region 11SR1. The conductive wires 11*w* may extend past the scribe line region 11SR1. The conductive wires 11*w* may be configured to electrically connect the memory chip 12 and the memory chip 13.

The conductive wires 11*w* may be configured to electrically connect to the memory chip 12 and the memory chip 13 to control the channel of the memory chip 12 and the memory chip 13. The conductive wires 11*w* may be configured to electrically connect to the memory chip 12 and the memory chip 13 to control the state of electrical charges stored in the storage capacitors thereof. The conductive wires 11*w* may be configured to electrically connect to the memory chip 12 and the memory chip 13 to combine the capacity (or the memory size) of the memory chip 12 and the memory chip 13. The conductive wires 11*w* may be configured to electrically connect to the memory chip 12 and the memory chip 13 to form a 2Gb memory device package.

In some embodiments, one or more circuit layers 11*c* may be formed in the substrate 11. The circuit layers 11*c* may extend between the chip regions 11CR. The circuit layers 11*c* may extend across the scribe line region 11SR1. The circuit layers 11*c* may extend past the scribe line region 11SR1. The circuit layers 11*c* may be configured to electrically connect to the memory chip 12 and the memory chip 13.

The circuit layers 11*c* may be configured to electrically connect to the memory chip 12 and the memory chip 13 to control the channel thereof. The circuit layers 11*c* may be configured to electrically connect to the memory chip 12 and the memory chip 13 to control the state of electrical charges stored in the storage capacitors thereof. The circuit layers 11*c* may be configured to electrically connect to the memory chip 12 and the memory chip 13 to combine the capacity (or the memory size) thereof. The circuit layers 11*c* may be configured to electrically connect to the memory chip 12 and the memory chip 13 to form a 2Gb memory device package. In some embodiments, the circuit layers 11*c* may include copper (Cu), silver (Ag), aluminum (Al), gold (Au), other metal, or an alloy thereof.

In some embodiments, the carrier 10 may include the conductive pads 10*p* providing electrical connection between the carrier 10 and the bundled memory chip (including the memory chip 12 and the memory chip 13). In some embodiments, the carrier 10 may include conductive pads (not shown) for providing electrical connections between the bundled memory chip (including the memory chip 12 and the memory chip 13) and an external electronic component (not shown). For example, the carrier 10 may be configured to provide electrical connection between the bundled memory chip (including the memory chip 12 and the memory chip 13) and an external electronic component (not shown).

For example, the memory device package 1*a* may be used in combination with (or be operatively coupled with) a computing device (such as a central processing unit (CPU)) and/or a memory controller. The carrier 10 may be configured to provide electrical connection between the bundled memory chip (including the memory chip 12 and the memory chip 13) and the computing device. The computing device may include a device for processing data and executing program requests from an external circuit, for example, a motherboard of a computing device.

The carrier 10 may be configured to provide electrical connection between the bundled memory chip (including the memory chip 12 and the memory chip 13) and the memory controller. The memory controller may include a digital circuit that manages program requests to and from the bundled memory chip (including the memory chip 12 and the memory chip 13). In some embodiments, the bundled memory chip (including the memory chip 12 and the memory chip 13) may be configured to store information, data, or a program run on a computing device or a memory controller.

The conductive wires 10*w* may be configured to electrically connect to the memory chip 12 and the memory chip 13 to control the channel of the memory chip 12 and the memory chip 13. The conductive wires 10*w* may be configured to electrically connect to the memory chip 12 and the memory chip 13 to control the state of electrical charges stored in the storage capacitors thereof.

In some embodiments, a package body (not shown) may be disposed over, cover, or contact a part of the surface 101 of the carrier 10. For example, the package body may be disposed over, cover, or contact the bundled memory chip (including the memory chip 12 and the memory chip 13). The conductive wires 10*w* and 11*w* may be covered or encapsulated by the package body.

In some embodiments, the package body may include molding material, such as a Novolac-based resin, an epoxy-based resin, a silicone-based resin, or other suitable encapsulant. Suitable fillers may also be included, such as powdered $SiO_2$.

In a conventional manufacturing process for memory chips, every memory chip of different sizes involves multiple photolithographic processing operations, in each of which a particular layout design and photomask of specific dimensions and/or patterns are required. Such requirements can greatly increase time and cost of manufacturing memory chips of different sizes.

For example, 50 photomasks are respectively required for fabricating the 4Gb memory chips, the 2Gb memory chips, and the 1Gb memory chips. Therefore, 150 photomasks in total need to be predesigned and prepared for fabricating the 4Gb memory chips, the 2Gb memory chips, and the 1Gb memory chips.

According to some embodiments of the present disclosure, plural photomasks can be reused, adopted, or shared among processes for manufacturing memory chips of different memory capacities. For example, 40 photomasks in the processes for manufacturing the 4Gb memory chips, the 2Gb memory chips, and the 1Gb memory chips can be reused, adopted, or shared.

After the photolithographic processing operations employing the 40 photomasks, the memory capacities of the memory chips on the wafer may be customized. For example, approximately 10 photomasks may be respectively customized and used for fabricating the 4Gb memory chips, the 2Gb memory chips, and the 1Gb memory chips. Therefore, only 70 photomasks in total need to be predesigned and prepared for fabricating the 4Gb memory chips, the 2Gb memory chips, and the 1Gb memory chips. In comparison with the conventional manufacturing process (in which 150 photomasks in total are required), time and cost of fabricating different memory chips can be greatly reduced.

According to some embodiments of the present disclosure, different numbers of memory chips on the wafer are scribed or separated together into one (or singular) bundled memory chip according to the customized memory capacities.

The wafer used in the processes for manufacturing memory chips of different memory capacities includes at least two types of scribe line regions. One type of the scribe line regions are finally scribed by, for example, a die saw operation, a scribe operation and/or a break operation, after fabrication of the wafer is completed. Another type of the scribe line regions are not scribed by the die saw operation and remain in the bundled memory chips.

The bundled memory chip (such as the bundled memory chip including the memory chips 12 and 13) includes circuit layers (such as the circuit layers 11*c*) in the wafer (such as the substrate 11) extending across the scribe line region (such as the scribe line region 11SR1). The circuit layers are configured to electrically connect memory chips and combine the capacity (or the memory size) of the memory chips.

The structure having the circuit layers in the wafer extending across the scribe line region can fulfill the customized connection configuration across memory device family members with different organizations or memory capacities (such as 2 Gb, 4 Gb, 8 Gb). The bundled memory chip can thus be encapsulated in a memory device package without redesigning the routing and the photomasks thereof to adapt to the different memory capacity. As a result, time and cost of fabricating different memory chips can be greatly reduced.

Figure 1C:
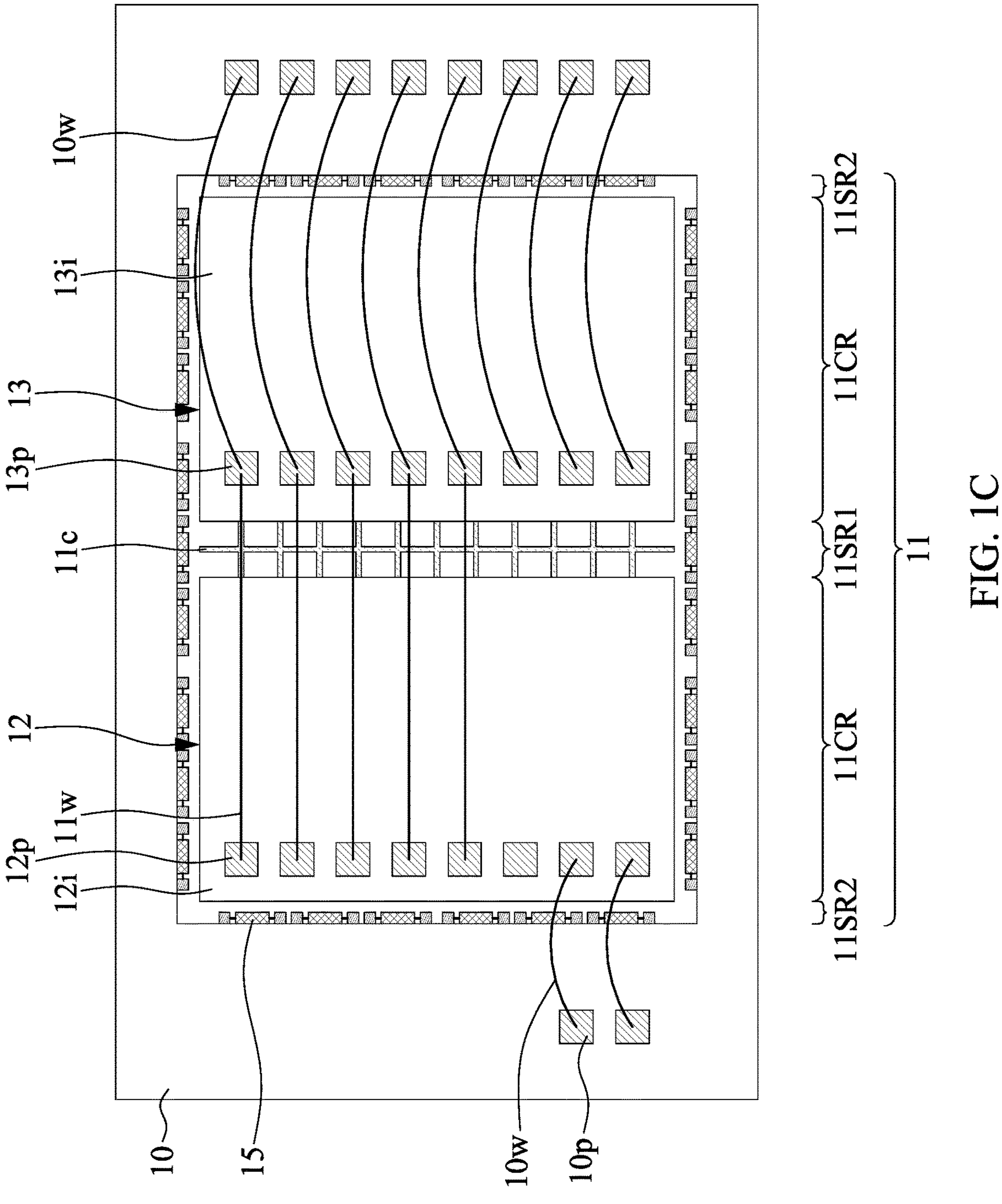
FIG. 1C is a schematic top view of a memory device package in accordance with some embodiments of the present disclosure.
Figure 1D:
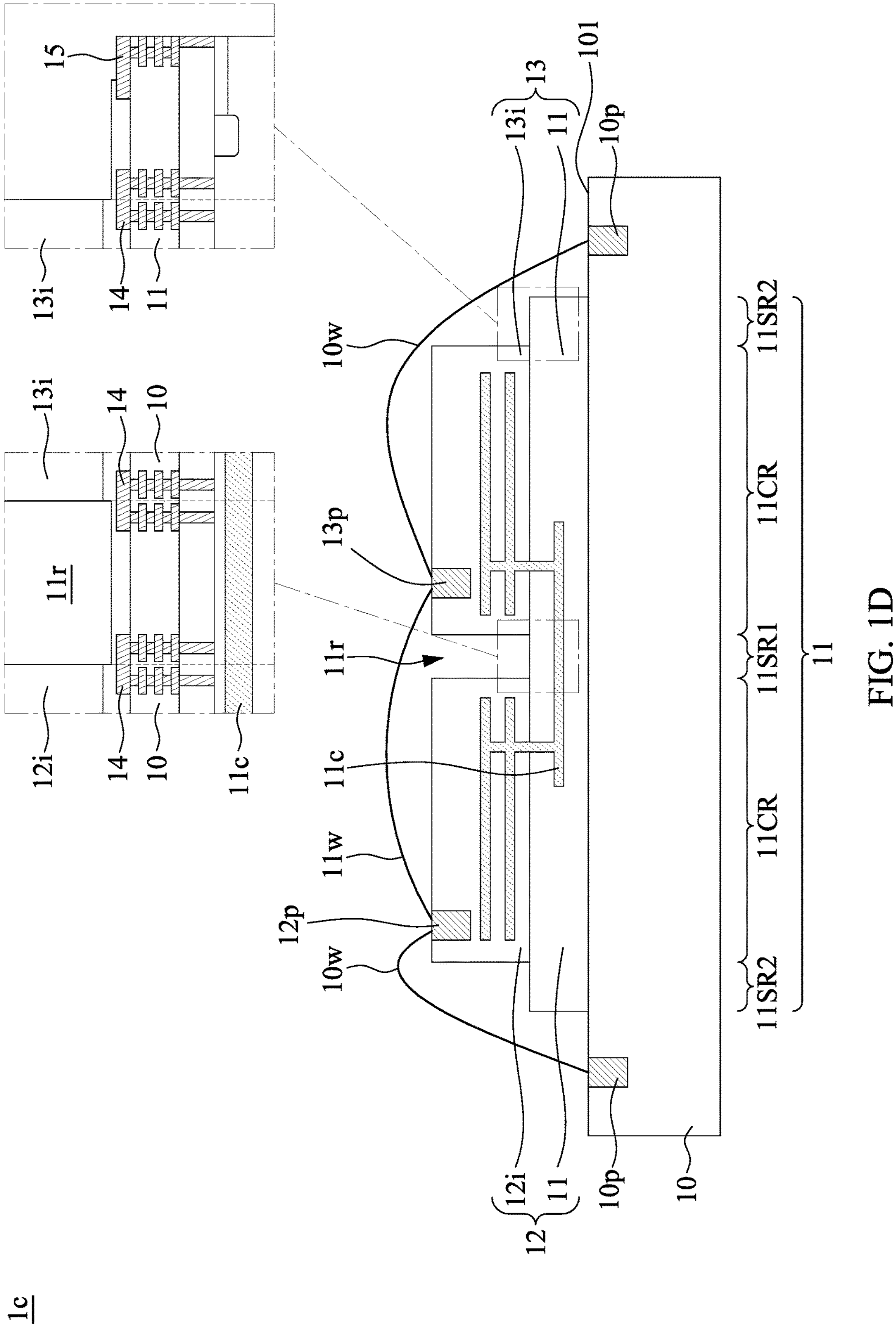
FIG. 1D is a schematic cross-sectional view of a memory device package in accordance with some embodiments of the present disclosure.

FIG. 1C is a schematic top view of a memory device package 1*c* in accordance with some embodiments of the present disclosure. FIG. 1D is a schematic cross-sectional view of the memory device package 1*c* in accordance with some embodiments of the present disclosure. The memory device package 1*c* is similar to the memory device package 1*a* in FIGS. 1A and 1B, with differences therebetween as follows.

The memory device package 1*c* includes the scribe line regions 11SR2 at least partially surrounding the memory chips 12 and 13. The testing elements 15 are disposed over the scribe line regions 11SR2. In some embodiments, after the scribe line regions 11SR2 are scribed, the width of each of the scribe line regions 11SR2 may be less than the width of each of the scribe line regions 11SR1. In some embodiments, after the scribe line regions 11SR2 are scribed, the testing elements 15 are also partially scribed or removed.

As shown in FIG. 1D, the memory device package 1*c* may include guard rings 14 disposed on a boundary between the chip regions 11CR and the scribe line regions 11SR1. The memory device package 1*c* may also include guard rings 14 disposed on a boundary between the chip regions 11CR and the scribe line regions 11SR2.

Figure 2A:
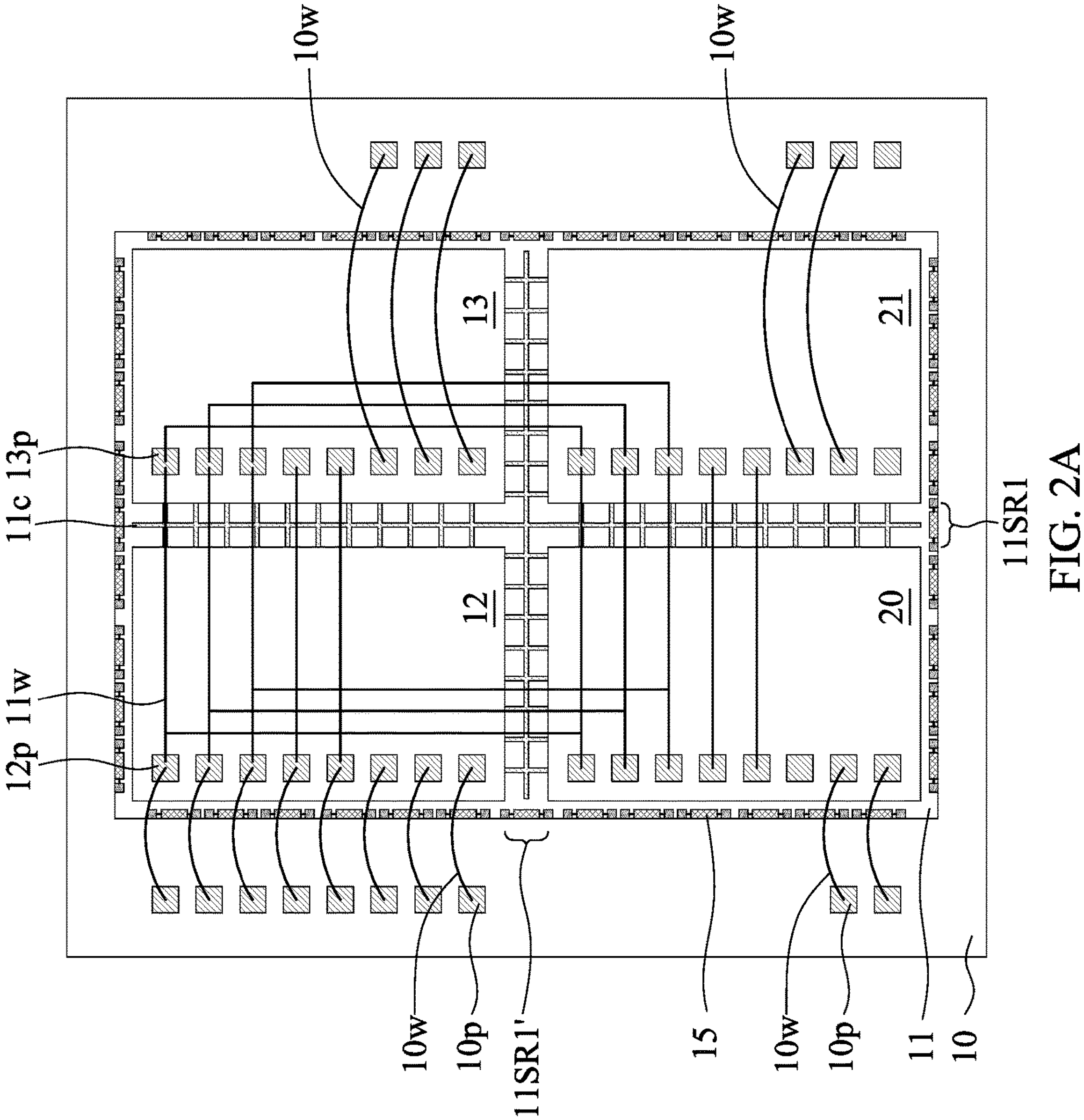
FIG. 2A is a schematic top view of a memory device package in accordance with some embodiments of the present disclosure.

FIG. 2A is a schematic top view of a memory device package 2*a* in accordance with some embodiments of the present disclosure. The memory device package 2*a* is similar to the memory device package 1*a* in FIG. 1A, with differences therebetween as follows.

The memory device package 2*a* may include four dies in total. For example, the memory device package 2*a* may include 4Gb. For example, the memory device package 2*a* may include memory chips 12, 13, 20, and 21. For example, the memory chips 12, 13, 20, and 21 may be dies bundled together into one bundled memory chip.

The memory chips 12, 13, 20, and 21 may be respectively electrically connected with the carrier 10 through the conductive wires 10*w*. The memory chips 12, 13, 20, and 21 may electrically connect with one another by conductive elements, such as the conductive wires 11*w*, the circuit layers 11*c*, or both.

The memory chips 12, 13, 20, and 21 may include dies over chip regions of a wafer. The memory chips 12, 13, 20, and 21 may be separated by the scribe line region 11SR1 and a scribe line region 11SR1' angled with respect to the scribe line region 11SR1. The scribe line region 11SR1 may be disposed between the memory chips 12 and 13 and between the memory chips 20 and 21. The scribe line region 11SR1' may be disposed between the memory chips 12 and 20 and between the memory chips 13 and 21.

Figure 2B:
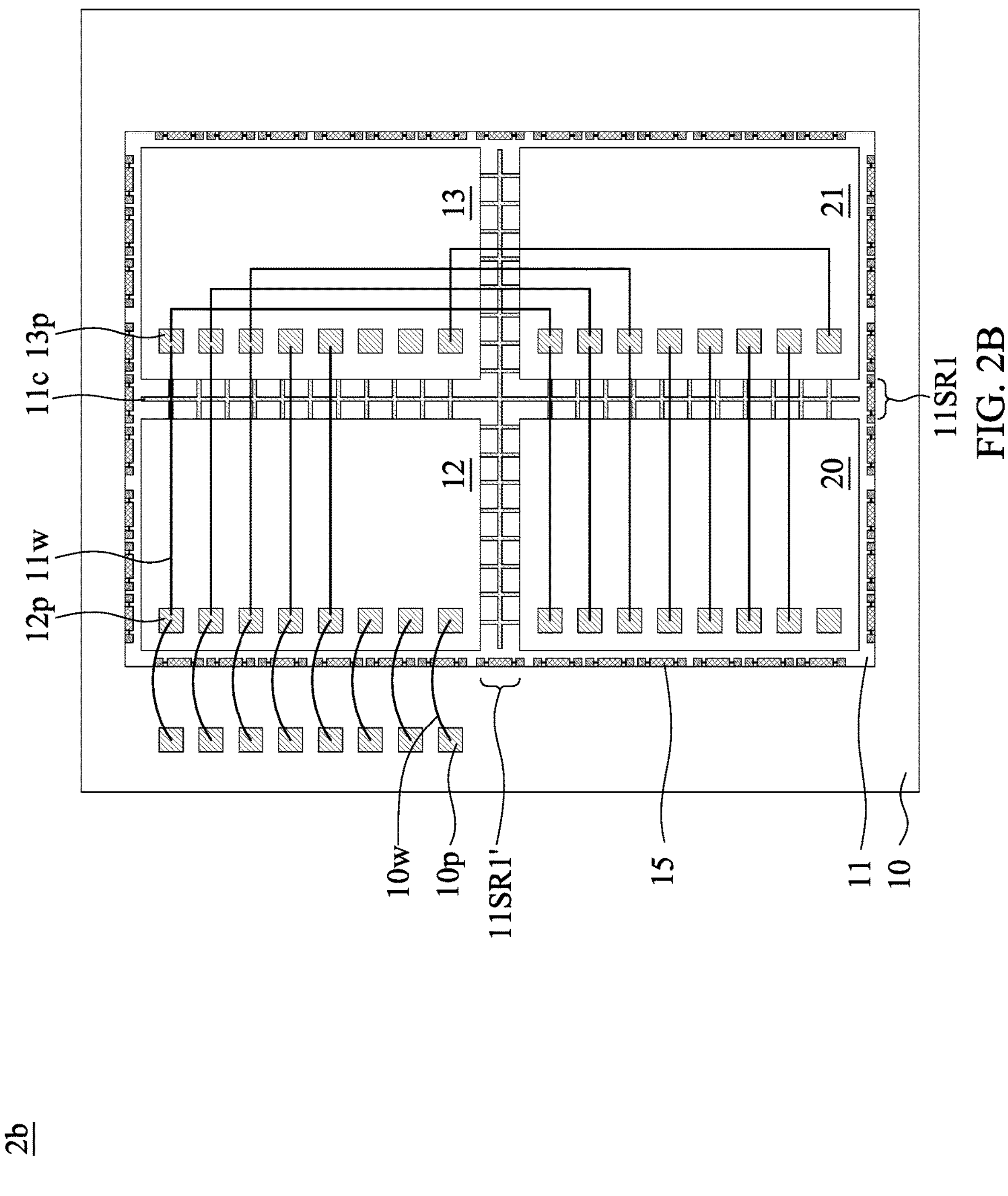
FIG. 2B is a schematic top view of a memory device package in accordance with some embodiments of the present disclosure.

FIG. 2B is a schematic top view of a memory device package 2*b* in accordance with some embodiments of the present disclosure. The memory device package 2*b* is similar to the memory device package 2*a* in FIG. 2A, with differences therebetween as follows.

The bundled memory chip (including the memory chips 12, 13, 20, and 21) may electrically connect with the carrier 10 through the conductive wires 10*w* connecting the conductive pads 12*p* and the conductive pads 10*p*. For example, the memory chip 13, 20, and 21 may respectively electrically connected with the carrier 10 through the memory chip 12.

FIGS. 3A, 3B, 3E, 3F, 3G, 3H, and 3I illustrate stages of a method of manufacturing a memory device package in accordance with some embodiments of the present disclosure. At least some of these figures have been simplified for a better understanding of the aspects of the present disclosure. In some embodiments, the memory device package 1*a* in FIG. 1A may be manufactured by the operations described below with respect to FIGS. 3A, 3B, 3E, and 3F. In some embodiments, the memory device package 2*a* in FIG. 2A may be manufactured by the operations described as follows with respect to FIGS. 3A, 3G, 3H, and 3I.

Referring to FIG. 3A, the wafer 30 is provided, as detailed in the previous paragraphs and not repeated hereafter. The chip regions 11CR and the scribe line regions 11SR are formed over the wafer 30. The dies may be formed on the chip regions 11CR, respectively.

In some embodiments, the memory capacities of the memory chips on the wafer are customized. In some embodiments, the memory capacities are determined after common photolithographic processing operations for manufacturing the 4Gb memory chips, the 2Gb memory chips, and the 1Gb memory chips. For example, the memory capacities may be determined after the photolithographic processing operations employing 40 photomasks.

Specifically, two dies in the dotted area 3*b* are separated from other dies by the scribe line regions 11SR2 and bundled together into one bundled memory chip (which includes the memory chips 12 and 13). Four dies in the dotted area 3*g* are separated from other dies by the scribe line regions 11SR2 and bundled together into one bundled memory chip (which includes the memory chips 12, 13, 20, 21). In some embodiments, 4Gb memory chips, the 2Gb memory chips, and the 1Gb memory chips may be formed on the same wafer 30.

Figure 3B:
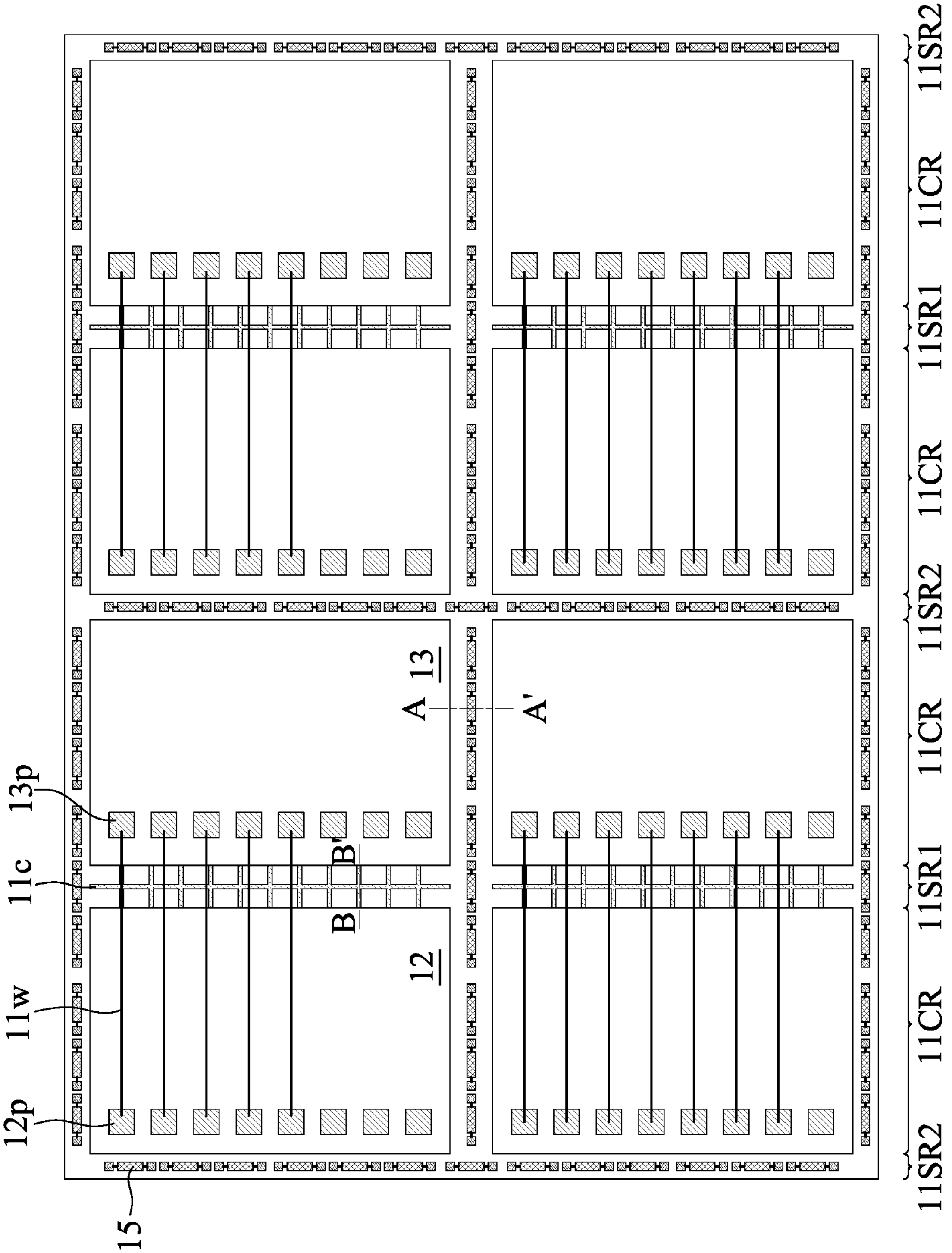
FIG. 3B illustrates one or more stages of a method of manufacturing a memory device package in accordance with some embodiments of the present disclosure.

FIG. 3B is an enlarged view of dotted area 3*b* of FIG. 3A. The memory chip 12 and the memory chip 13 may electrically connect by conductive elements, such as the conductive wires 11*w*, the circuit layers 11*c*, or both. In some embodiments, the testing elements 15 are formed over the scribe line regions 11SR2.

Figure 3C:
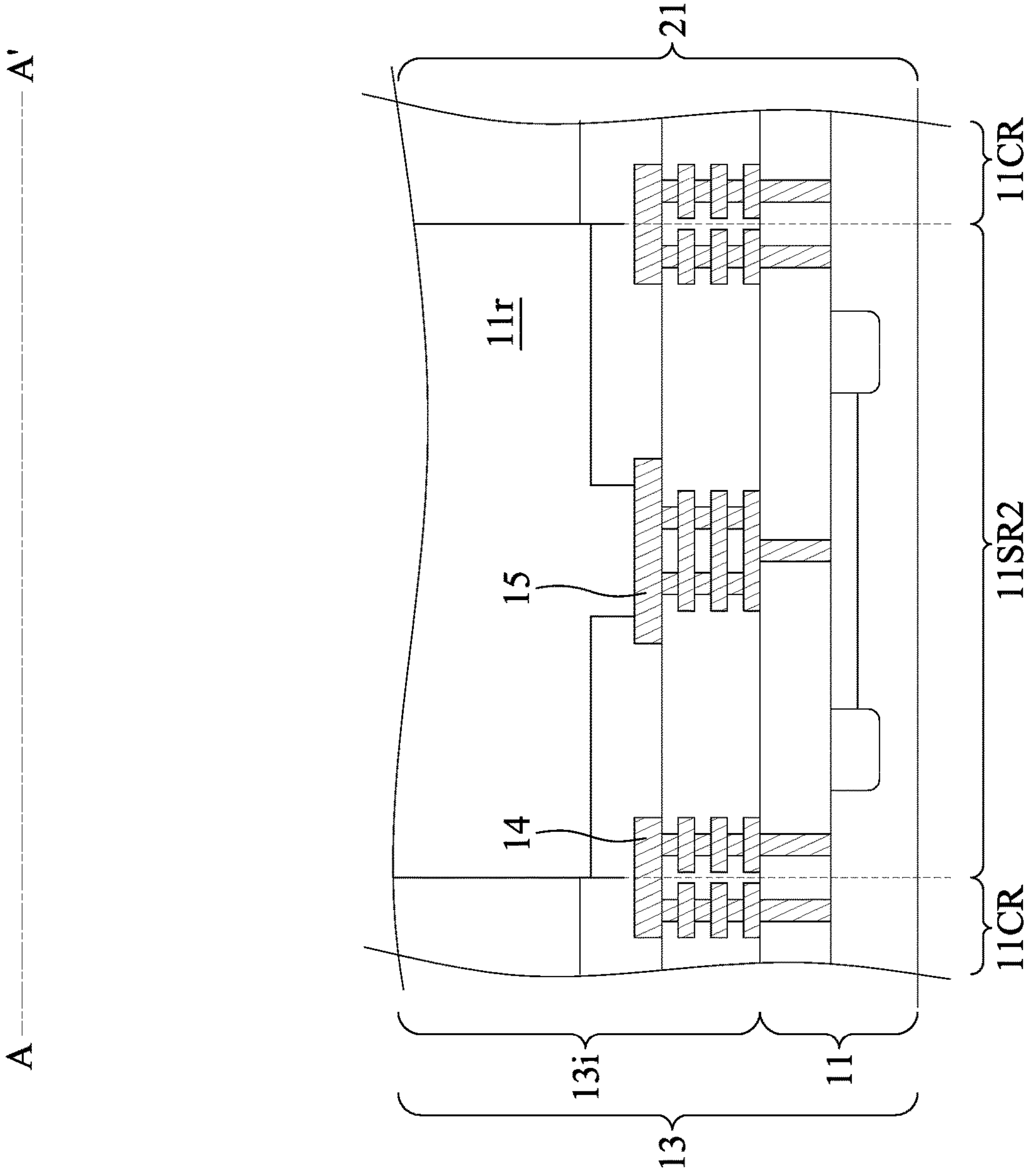
FIG. 3C is a schematic cross-sectional view of a memory device package in accordance with some embodiments of the present disclosure.

FIG. 3C is a cross-section along line AA' of FIG. 3B, in which guard rings 14 are disposed on boundaries between the chip regions 11CR and the scribe line region 11SR2. The testing element 15 is disposed between the guard rings 14. The testing element 15 is exposed to air through the recessed portion 11*r*.

Figure 3D:
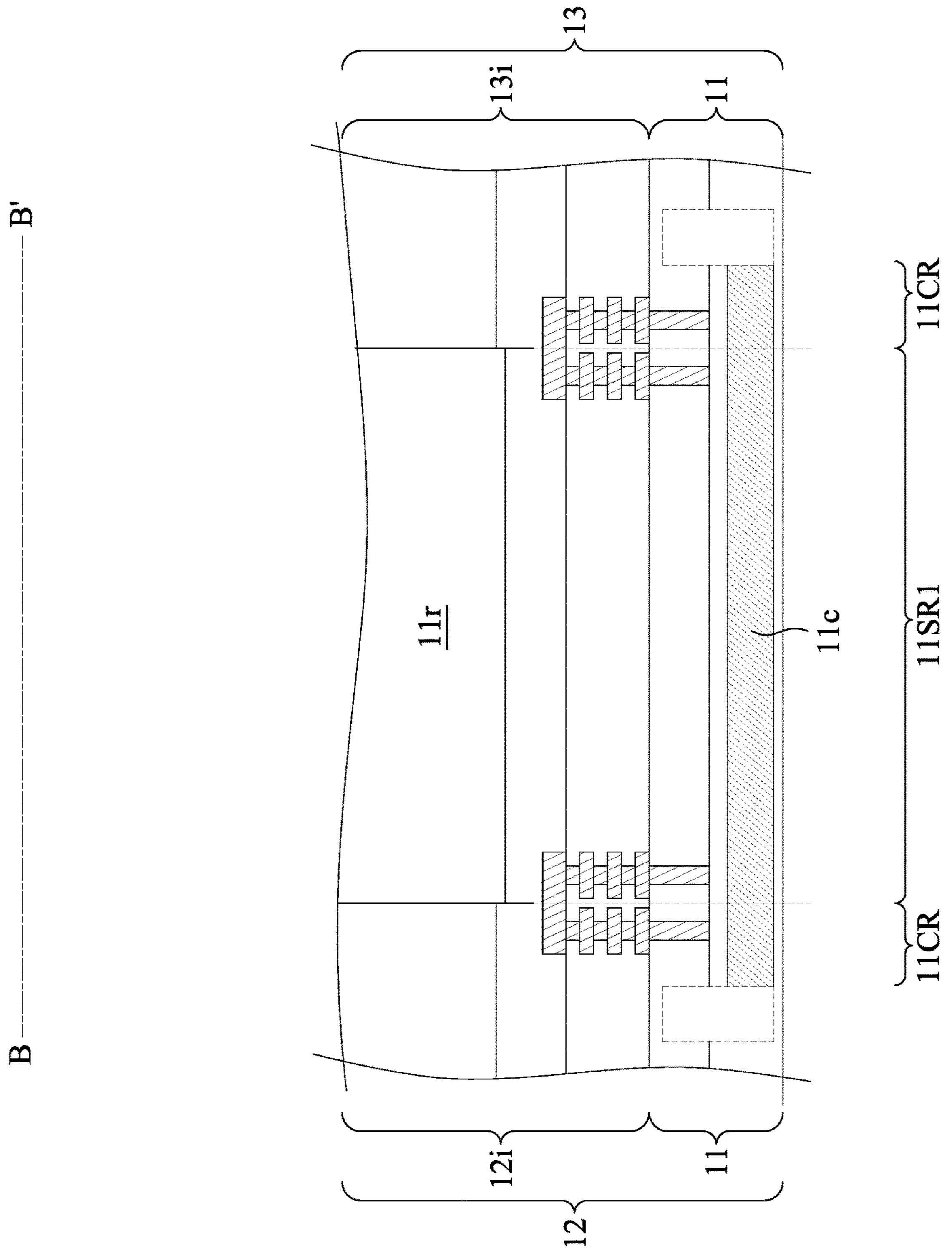
FIG. 3D is a schematic cross-sectional view of a memory device package in accordance with some embodiments of the present disclosure.

FIG. 3D is a cross-section along line BB' of FIG. 3B, in which guard rings 14 are disposed on boundaries between the chip regions 11CR and the scribe line region 11SR1. The scribe line region 11SR1 is exclusive of the testing element 15.

Figure 3E:
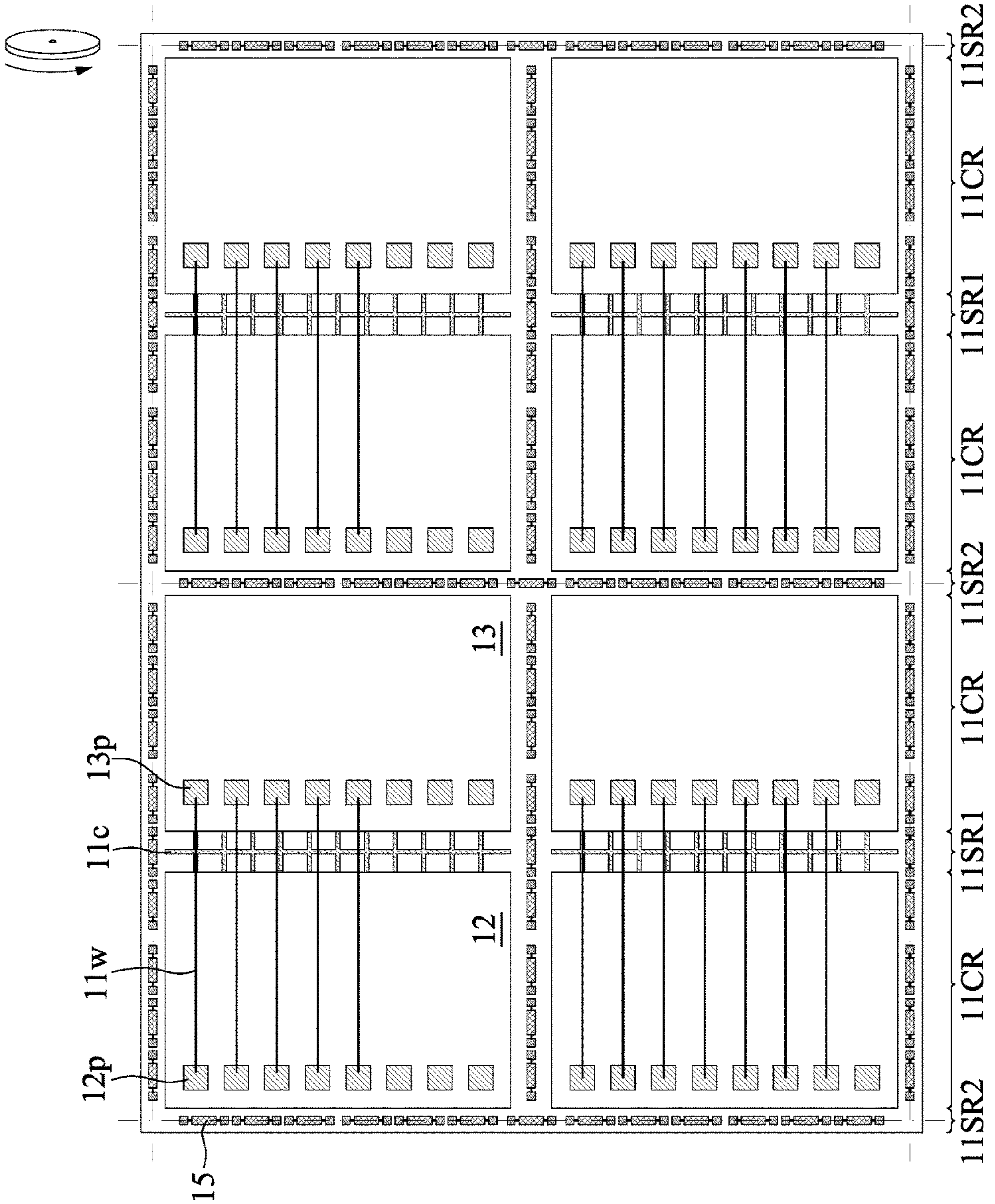
FIG. 3E illustrates one or more stages of a method of manufacturing a memory device package in accordance with some embodiments of the present disclosure.

Referring to FIG. 3E, the bundled memory chip including the memory chips 12 and 13 is separated from other dies of the wafer by scribing the scribe line regions 11SR2, by, for example, a die saw operation, a scribe operation, or a break operation.

Figure 3F:
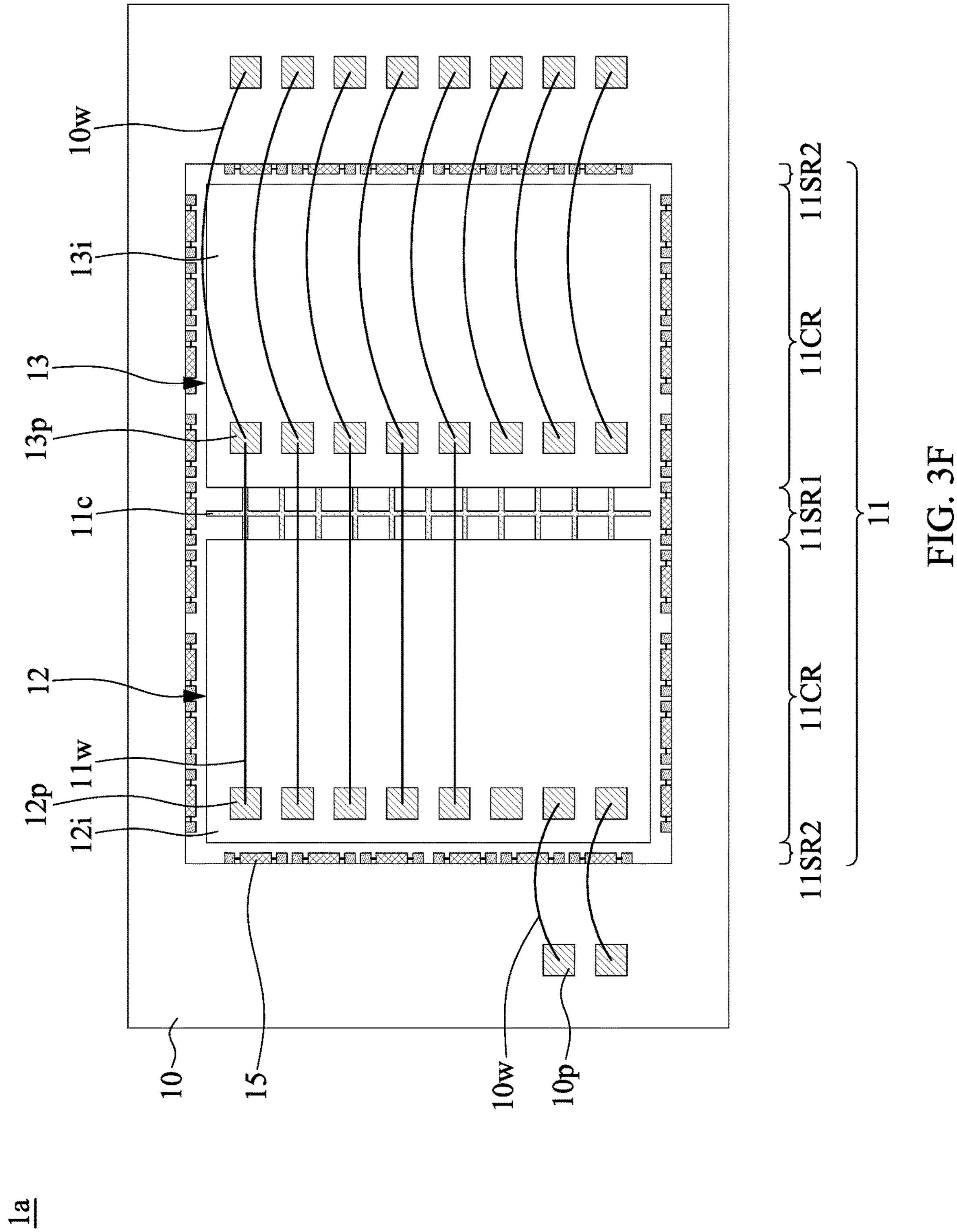
FIG. 3F illustrates one or more stages of a method of manufacturing a memory device package in accordance with some embodiments of the present disclosure.

Referring to FIG. 3F, the structure obtained from the operation of FIG. 3E includes the substrate 11 carrying the memory chips 12 and 13. The substrate 11 includes the scribe line region 11SR1. The substrate 11 is disposed over or on the carrier 10 and electrically connected with the carrier 10 through the conductive wires 10*w*. The substrate 11 is disposed over or on the carrier 10 while maintaining the scribe line region 11SR1 over or on the carrier 10.

Figure 3G:
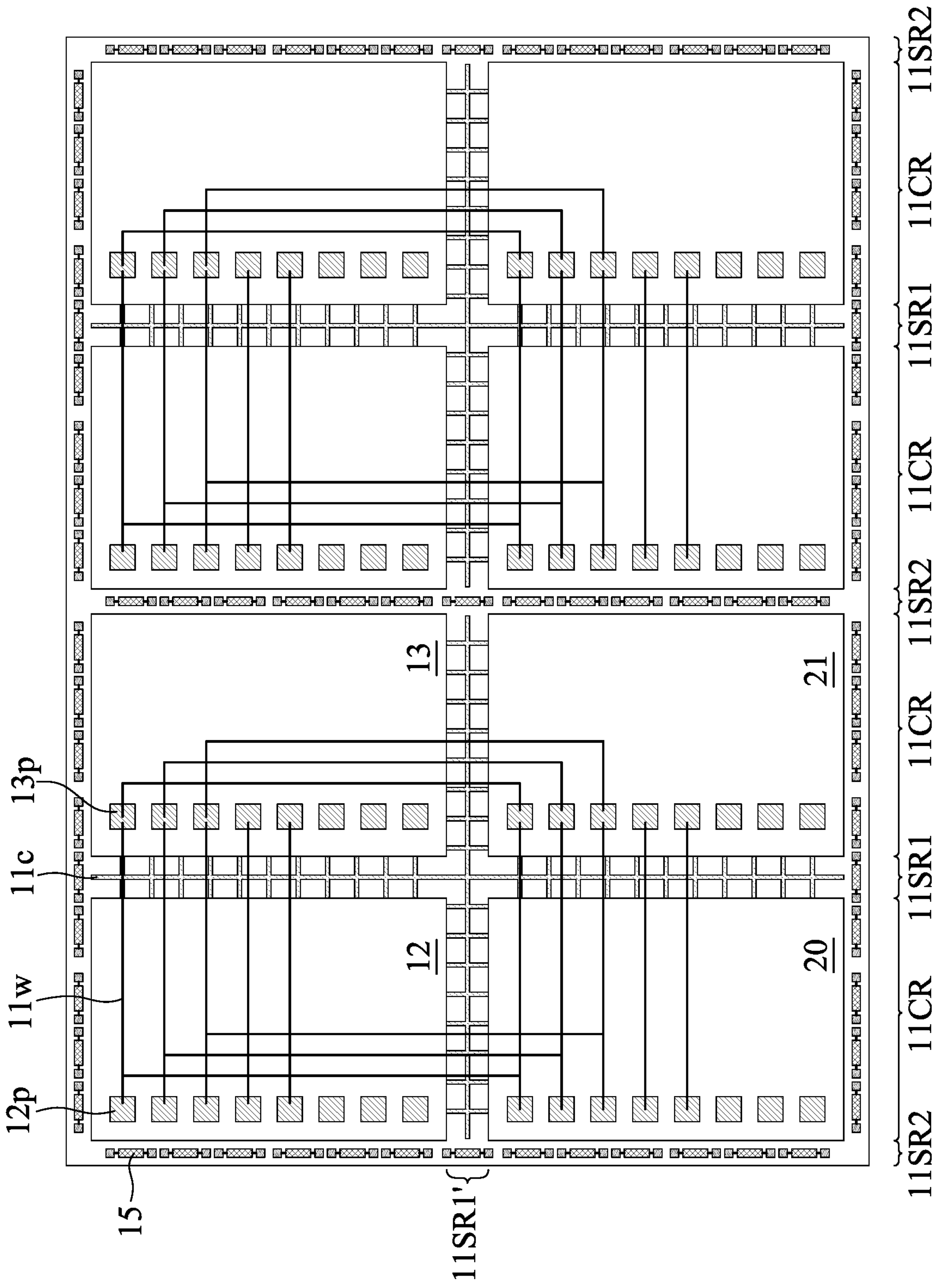
FIG. 3G illustrates one or more stages of a method of manufacturing a memory device package in accordance with some embodiments of the present disclosure.

FIG. 3G is an enlarged view of the dotted area 3*g* of FIG. 3A, in which memory chips 12, 13, 20, and 21 may be electrically connected with each other by conductive elements, such as the conductive wires 11*w*, the circuit layers 11*c*, or both.

The scribe line region 11SR1 may be disposed between the memory chips 12 and 13 and between the memory chips 20 and 21. The scribe line region 11SR1' may be disposed between the memory chips 12 and 20 and between the memory chips 13 and 21. In some embodiments, the testing elements 15 are formed over the scribe line regions 11SR2.

Figure 3H:
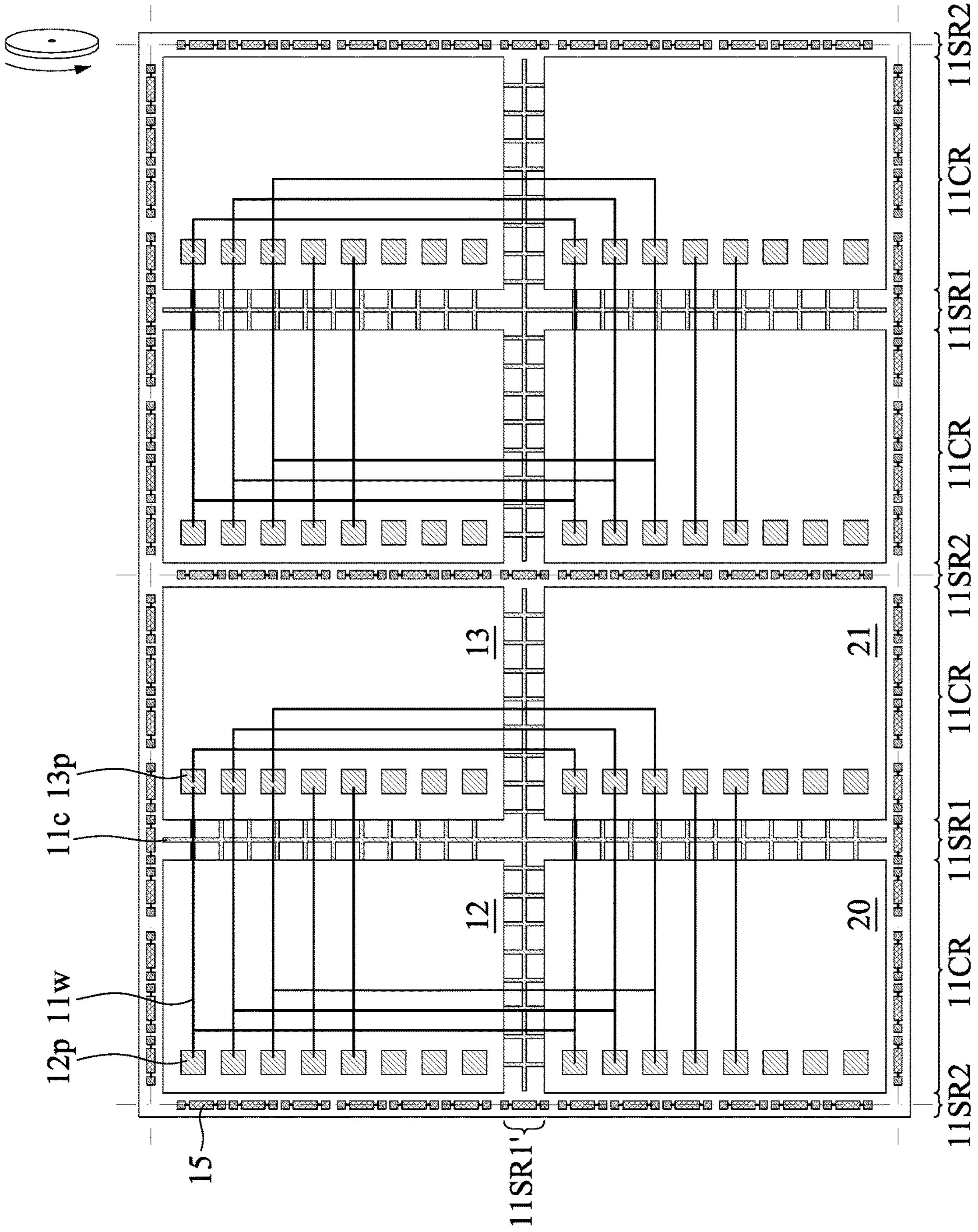
FIG. 3H illustrates one or more stages of a method of manufacturing a memory device package in accordance with some embodiments of the present disclosure.

Referring to FIG. 3H, the bundled memory chip including the memory chips 12, 13, 20, and 21 is separated from other dies of the wafer by scribing the scribe line regions 11SR2, by, for example, a die saw operation, a scribe operation or a break operation.

Figure 3I:
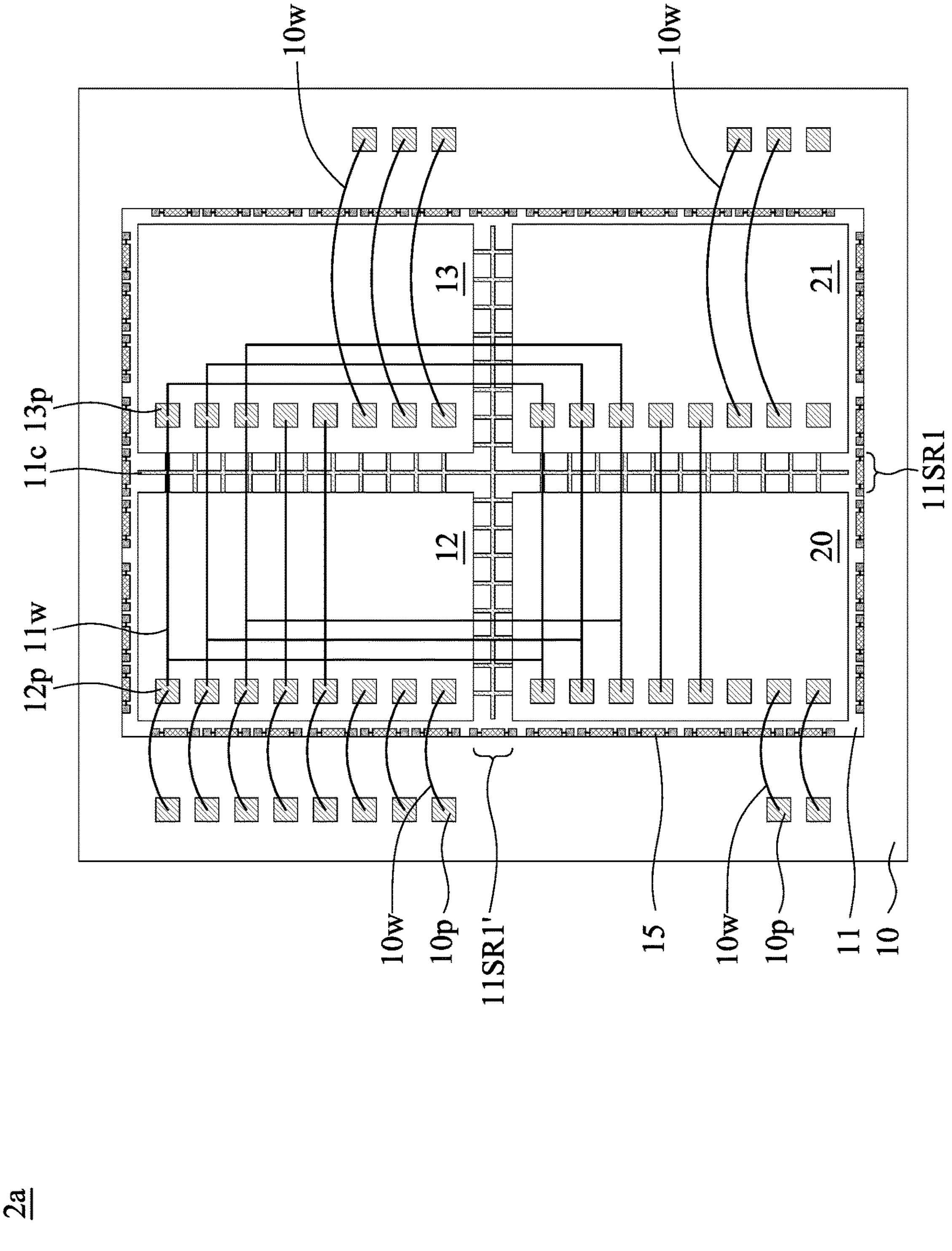
FIG. 3I illustrates one or more stages of a method of manufacturing a memory device package in accordance with some embodiments of the present disclosure.

Referring to FIG. 3I, the structure obtained from the operation of FIG. 3H includes the substrate 11 carrying the memory chips 12, 13, 20, and 21. The substrate 11 includes the scribe line regions 11SR1 and 11SR1'. The substrate 11 is disposed over or on the carrier 10 and electrically connected with the carrier 10 through the conductive wires 10*w*. The substrate 11 is disposed over or on the carrier 10 while maintaining the scribe line regions 11SR1 and 11SR1' over or on the carrier 10.

Figure 4:
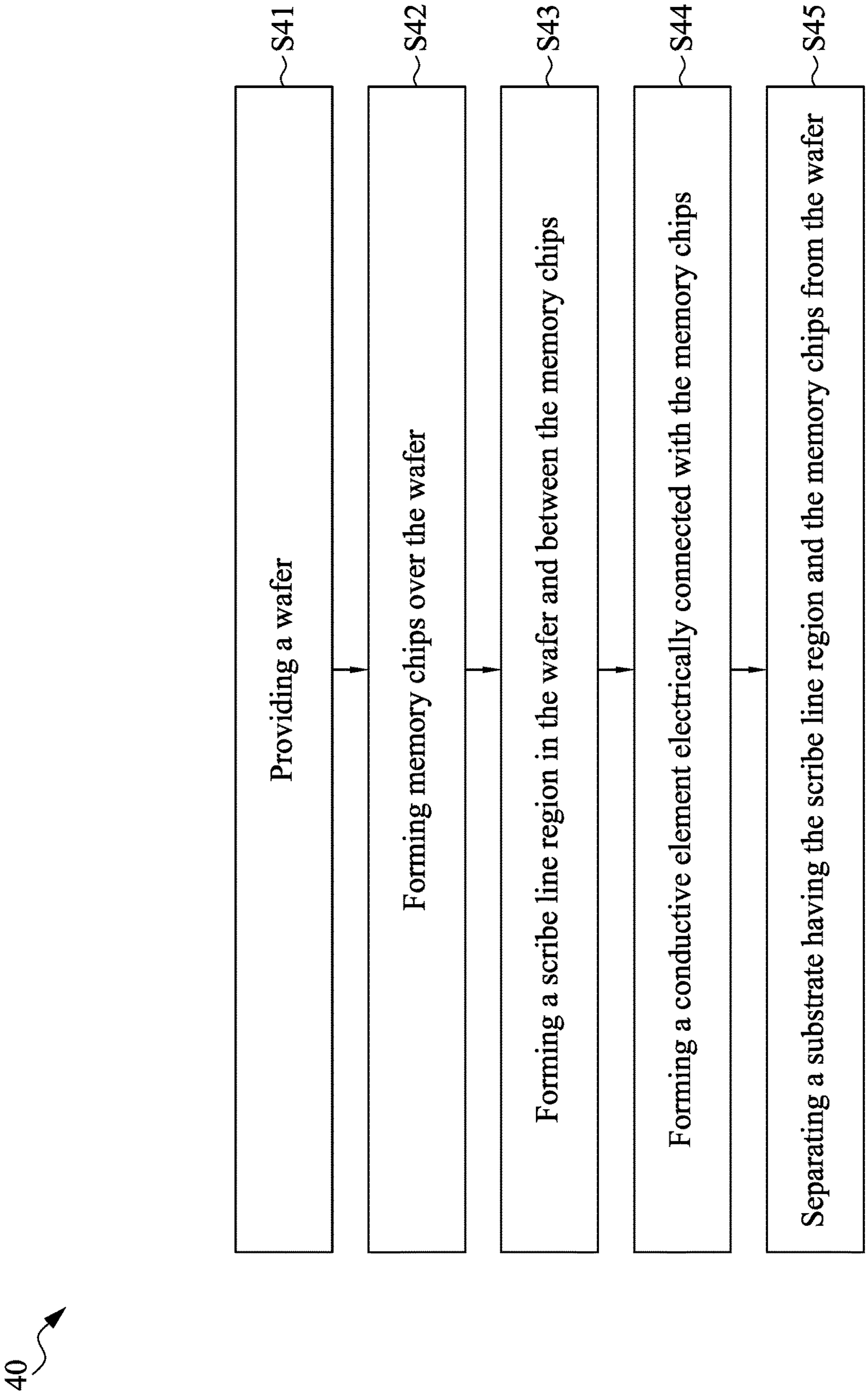
FIG. 4 is a flowchart of a method of manufacturing a memory device package in accordance with some embodiments of the present disclosure.

FIG. 4 is a flowchart of a method 40 of manufacturing a memory device package in accordance with some embodiments of the present disclosure.

The step or operation S41 is providing a wafer. For example, as shown in FIG. 3A, the wafer 30 is provided.

The step or operation S42 is forming memory chips over the wafer. The step or operation S43 is forming a scribe line region in the wafer and between the memory chips. The operation S42 and the operation S43 may be substantially simultaneous. For example, as shown in FIG. 3A, the chip regions 11CR and the scribe line regions 11SR are formed over the wafer 30. The dies may be formed on the chip regions 11CR, respectively.

The step or operation S44 is forming a conductive element electrically connected with the memory chips. For example, as shown in FIG. 3B, the memory chip 12 and the memory chip 13 are electrically connected with each other by conductive elements, such as the conductive wires 11*w*, the circuit layers 11*c*, or both.

The step or operation S45 is separating a substrate having the scribe line region and the memory chips from the wafer. For example, as shown in FIG. 3E, the bundled memory chip including the memory chips 12 and 13 is separated from other dies of the wafer by scribing the scribe line regions 11SR2, by, for example, a die saw operation, a scribe operation or a break operation. The structure obtained from the operation of FIG. 3E includes the substrate 11 carrying the memory chips 12 and 13.

One aspect of the present disclosure provides a memory device package. The memory device package includes a substrate having a first chip region, a second chip region, and a first scribe line region connected between the first chip region and the second chip region. The memory device package also includes a first memory chip disposed over the first chip region and a second memory chip disposed over the second chip region.

Another aspect of the present disclosure provides a memory device package. The memory device package includes a substrate having a first scribe line region, a first memory chip disposed over the substrate and a second memory chip disposed over the substrate. The second memory chip is electrically connected with first memory chip through a circuit layer extending across the first scribe line region.

Another aspect of the present disclosure provides a method of manufacturing a memory device package. The method includes providing a wafer, forming a first memory chip over the wafer, and forming a second memory chip over the wafer. The method also includes forming a first scribe line region in the wafer and between the first memory chip and the second memory chip. The method also includes separating a substrate having the first scribe line region, the first memory chip, and the second memory chip from the wafer.

According to some embodiments of the present disclosure, different numbers of memory chips on the wafer are scribed or separated together into one (or singular) bundled memory chip according to the customized memory capacities. The bundled memory chip includes circuit layers in the wafer extending across the scribe line region. The circuit layers are configured to electrically connect memory chips and to combine the capacity (or the memory size) of the memory chips.

The structure having the circuit layers in the wafer extending across the scribe line region can fulfill the customized connection configuration across memory device family members with different organizations or memory capacities (such as 2 Gb, 4 Gb, 8 Gb). The bundled memory chip can thus be encapsulated in a memory device package without redesigning the routing and the photomasks thereof to adapt to the different memory capacity. As a result, time and cost of fabricating different memory chips can be greatly reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device package, comprising:

a substrate having a first chip region, a second chip region, and a first scribe line region connected between the first chip region and the second chip region;

a carrier comprising a first carrier conductive pad and a second carrier conductive pad, wherein the substrate is disposed on the carrier;

a first memory chip disposed over the first chip region at a position that the first chip region is positioned between the first memory chip and the carrier, wherein the first memory chip comprises a first conductive pad;

a second memory chip disposed over the second chip region at a position that the second chip region is positioned between the second memory chip and the carrier, wherein the second memory chip comprises a second conductive pad;

a first conductive wire disposed outside of the substrate, wherein the first memory chip and the second memory chip are electrically connected through the first conductive wire, wherein the first conductive wire is electrically connected between the first conductive pad and the second conductive pad;

a second conductive wire disposed outside of the substrate, wherein the second conductive wire is electrically connected between the first conductive pad and the first carrier conductive pad to electrically connect the first memory chip to the carrier;

a third conductive wire disposed outside of the substrate, wherein the third conductive wire is electrically connected between the second conductive pad and the second carrier conductive pad to electrically connect the second memory chip to the carrier; and a circuit layer disposed in the substrate, wherein the first memory chip and the second memory chip are electrically connected through the circuit layer.

2. The memory device package of claim 1, wherein the first memory chip comprises a first capacity and the second memory chip comprises a second capacity, and the first chip and the second chip are bundled together to form the memory device package having a third capacity.

3. The memory device package of claim 2, wherein the third capacity equals to a sum of the first capacity and the second capacity.

4. The memory device package of claim 1, wherein the first conductive wire extends across the first scribe line region in order to connect between the first conductive pad and the second conductive pad.

5. The memory device package of claim 1, wherein the first conductive wire is configured to combine a capacity of the first memory chip and a capacity of the second memory chip.

6. The memory device package of claim 1, wherein the circuit layer extends between the first chip region and the second chip region and extends across the first scribe line region, wherein the circuit layer is embedded within the substrate.

7. The memory device package of claim 1, wherein the circuit layer is configured to combine a capacity of the first memory chip and a capacity of the second memory chip, wherein the substrate is disposed on the carrier at a position that the first carrier conductive pad and the second conductive pad are uncovered by the substrate.

8. The memory device package of claim 1, wherein the substrate further comprises a third scribe line region angled with respect to the first scribe line region.

* * * * *